United States Patent
Hu et al.

(10) Patent No.: US 11,754,601 B2
(45) Date of Patent: Sep. 12, 2023

(54) MEASURING FREQUENCY OF MICROWAVE SIGNAL

(71) Applicant: SHANXI UNIVERSITY, Shanxi (CN)

(72) Inventors: Jianyong Hu, Shanxi (CN); Ruiyun Chen, Shanxi (CN); Chengbing Qin, Shanxi (CN); Guofeng Zhang, Shanxi (CN); Jie Ma, Shanxi (CN); Liantuan Xiao, Shanxi (CN); Suotang Jia, Shanxi (CN)

(73) Assignee: SHANXI UNIVERSITY, Shanxi (CN)

( * ) Notice: Subject to any disclaimer, the term of this patent is extended or adjusted under 35 U.S.C. 154(b) by 59 days.

(21) Appl. No.: 17/128,206

(22) Filed: Dec. 21, 2020

(65) Prior Publication Data
US 2021/0364559 A1    Nov. 25, 2021

(30) Foreign Application Priority Data
May 21, 2020   (CN) .......................... 202010435638.3

(51) Int. Cl.
  *G01R 23/02*    (2006.01)
  *G01R 23/16*    (2006.01)

(52) U.S. Cl.
  CPC ............. *G01R 23/02* (2013.01); *G01R 23/16* (2013.01)

(58) Field of Classification Search
  CPC ........ G01R 23/00; G01R 23/02; G01R 23/04; G01R 23/16; G01R 29/08; G01R 29/0864; G01R 29/0871; G01R 29/0885
  See application file for complete search history.

(56) References Cited

U.S. PATENT DOCUMENTS

2017/0331560 A1* 11/2017 Hu ........................ H04B 10/532
2020/0209020 A1*  7/2020 Issa ......................... G01K 11/32

FOREIGN PATENT DOCUMENTS

| CN | 101526393   |   | 9/2009  |           |
|----|-------------|---|---------|-----------|
| CN | 103837742   |   | 6/2014  |           |
| CN | 108152582   |   | 6/2018  |           |
| CN | 110716207   |   | 1/2020  |           |
| CN | 110716207 A | * | 1/2020  |           |
| CN | 113330320 A | * | 8/2021  | G01R 15/241 |
| EP | 2330637     |   | 7/2014  |           |

OTHER PUBLICATIONS

Duvillaret, Lionel "Electro-optic sensors for electric field measurements," J. Opt. Soc. Am. B/vol. 19, No. 11/Nov. 2002, pp. 2692-2702 (Year: 2002).*
"Office Action of China Counterpart Application", dated Apr. 15, 2021, with English translation thereof, p. 1-p. 14.
Zou Xihua et al., "Photonic Approach Using Quadrature Optical Power Ratios for Microwave Frequency Measurement," Acta Optica Sinica, vol. 31, Mar. 2011, pp. 1-5.

\* cited by examiner

*Primary Examiner* — Son T Le
*Assistant Examiner* — Matthew W. Baca
(74) *Attorney, Agent, or Firm* — JCIP GLOBAL INC.

(57) ABSTRACT

A frequency measurement method and a system thereof are provided. The method includes: generating to-be-detected emergent light under an action of the electro-optical crystal when a light source irradiates an electro-optical crystal disposed in the microwave electric field; detecting, by a single-photon detector, the to-be-detected emergent light to obtain a detection result of the single-photon detector; and determining a frequency of the microwave signal based on the detection result of the single-photon detector and a Fourier transform algorithm.

11 Claims, 6 Drawing Sheets

MEASURING FREQUENCY OF MICROWAVE SIGNAL

CROSS-REFERENCE TO RELATED APPLICATION

This application claims the priority benefit of China application serial no. 202010435638.3, filed on May 21, 2020. The entirety of the above-mentioned patent application is hereby incorporated by reference herein and made a part of this specification.

TECHNICAL FIELD

The present disclosure relates to the technical field of microwave signal measurement, and in particular, to a frequency measurement method and system for a microwave signal.

BACKGROUND

Wireless communication plays an important role in modern society, and wireless communication technology has become an essential tool in our daily life. As increasing demands of users, the requirement for communication bandwidth is increasing. This requires the carrier frequency of the wireless communication to be constantly increased, so as to improve the bandwidth, especially in recent years, the 5G communication technology has been developed, and the carrier frequency has been increased to the order of 50 GHz. Characterization of carrier frequencies precisely can help to improve the quality communication systems. In addition, the microwave communication technology is also widely applied in fields of high-power electromagnetic signal transmission, military radar, and the like. Measurements of microwave frequencies may accurately analyze the type and distribution of the radio signals, and have an important meaning for a battle. However, conventional microwave measurement techniques do not enable accurate measurement of the frequency of the microwave signal simultaneously in a wide band.

SUMMARY

A microwave signal frequency measurement method and system are provided in the embodiments of the present disclosure.

In one aspect of the present disclosure, a frequency measurement method of a microwave signal is provided. The method includes: generating, when a light source irradiates an electro-optical crystal disposed in a microwave electric field, to-be-detected emergent light under an action of the electro-optical crystal; detecting, by a single-photon detector, the to-be-detected emergent light to obtain a detection result of the single-photon detector; determining a frequency of the microwave signal based on the detection result of the single-photon detector and a Fourier transform algorithm.

In one aspect of the present disclosure, a frequency measurement system for a microwave signal is provided. The system includes a microwave sensor, a detection processor and a digital signal processor. The microwave sensor includes an electro-optical crystal configured to be disposed in the microwave electric field, wherein when a light source irradiates on the electro-optical crystal, the light source generates to-be-detected emergent light under the action of the electro-optical crystal. The detection processor includes a single-photon detector configured to detect the to-be-detected emergent light to obtain a detection result of the single-photon detector. The digital signal processor is configured to determine a frequency of the microwave signal in the microwave electric field based on the detection result of the single-photon detector and a Fourier transform algorithm.

BRIEF DESCRIPTION OF THE DRAWINGS

In order to describe the embodiments of the present disclosure more clearly, the accompanying drawings required for describing the embodiments are briefly introduced below. Obviously, the accompanying drawings in the following description are merely some embodiments of the present disclosure, and for a person of ordinary skill in the art, other drawings may be obtained according to the accompanying drawings without creative efforts.

DETAILED DESCRIPTION OF THE EMBODIMENTS

The embodiments of the present disclosure are described in further detail below. It is emphasized that the embodiments described in the present disclosure are illustrative and not limiting, therefore the present disclosure is not limited to the described specific embodiments, and any other embodiments derived by those skilled in the art according to the technical solutions of the present disclosure also belong to the scope of protection of the present disclosure.

Traditional measurement for broadband microwave frequency adopts scanning filter and calculating spectrum. The scanning filter has a low spectral resolution, and a scanning speed is slow, and only a spectral signal within one bandwidth is recorded at a time, thereby easily causing the time-varying signal to be omitted. The spectrum is calculated by sampling the input signal to obtain a quantized signal and calculating the quantized signal with a Fourier algorithm. However, the detectable bandwidth of this method is limited by the sampling theorem, that is, the signal bandwidth cannot exceed one-half of the sampling frequency. Due to factors such as data transmission, data storage space and computation speed of a processor, measurement bandwidth of an existing system is limited to an order of GHz, such that an existing measurement for microwave frequency has a problem of small bandwidth, large data amount, and high hardware requirements.

Figure 1:
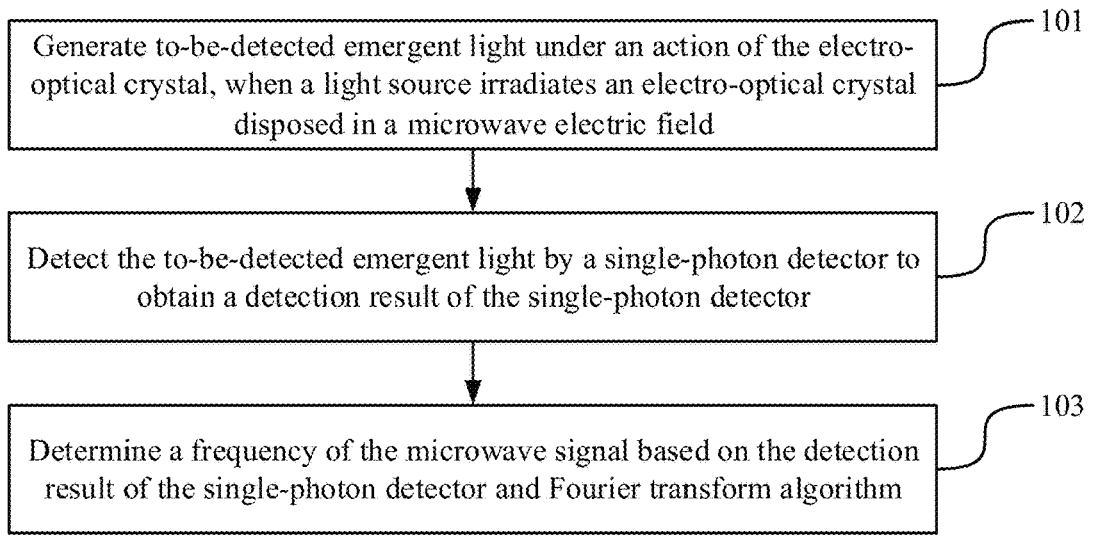
FIG. 1 is a flowchart of a frequency measurement method of a microwave signal according to an embodiment of the present disclosure.

A frequency measurement method of a microwave signal is provided according to an embodiment of the present disclosure. Specifically, a method of microwave frequency measurement with converting the microwave signal into an optical signal by using an electro-optical crystal as a sensor is provided. FIG. 1 illustrates a flowchart of the frequency measurement method of the microwave signal. The processing flow of the method may include the following steps.

At Step 101, when a light source irradiates an electro-optical crystal disposed in a microwave electric field, to-be-detected emergent light is generated under an action of the electro-optical crystal.

In this step, the electro-optical crystal is disposed in a to-be-detected microwave electric field, and the microwave electric field acts on the electro-optical crystal, thereby changing the electro-optical crystal's optical characteristic. After the light passes through the electro-optical crystal, intensity thereof is changed, and the optical signal thereof is modulated. Thus, the light source generates a modulated optical signal under the action of the electro-optic crystal. In an example, in the polarization modulation, the electro-optical crystal is also used for changing the polarization of light.

At Step 102, the to-be-detected emergent light is detected by a single-photon detector to obtain a detection result of the single-photon detector.

At Step 103, a frequency of the microwave signal is determined based on the detection result of the single-photon detector and Fourier transform algorithm.

In an example, prior to detecting the to-be-detected emergent light by the single-photon detector, the method further includes: inputting the to-be-detected emergent light into a polarization beam splitter, and inputting an output of the polarization beam splitter into an attenuator to attenuate the to-be-detected emergent light to the single-photon level. The polarization beam splitter is configured to selectively output a fixed polarization state of light. When the polarization state of the light incident into the polarization beam splitter changes, the light intensity output from the polarization beam splitter changes accordingly, thereby an optical signal with the modulated light intensity is from the polarization beam splitter. After passing through the attenuator, the optical signal is attenuated to the single-photon level.

In an example, detecting the to-be-detected emergent light by the single-photon detector includes: detecting the to-be-detected emergent light at the single-photon level by the single-photon detector.

In an example, the detection result includes arrival time of a photon of the to-be-detected emergent light, and detecting the to-be-detected emergent light by the single-photon detector to obtain the detection result includes: detecting the to-be-detected emergent light by the single-photon detector; and recording, by a time-to-digital conversion device, the arrival time of the photon of the to-be-detected emergent light when a pulse signal from the single-photon detector is sent to the time-to-digital conversion device.

In an example, based on the detection result of the single-photon detector and the Fourier transform algorithm, determining the frequency of the to be detected microwave signal includes: performing discrete Fourier transform on the arrival time of the photons of the to-be-detected emergent light to obtain frequency information of the microwave electric field.

In an example, when the light source irradiates the electro-optical crystal, the method further includes: adjusting a polarization direction of the light source incident into the electro-optical crystal, such that an angle of 45 degrees is formed by the polarization direction of the light source and an optical axis direction of the electro-optical crystal.

In an example, generating the to-be-detected emergent light under the action of the electro-optical crystal includes: based on a polarization modulation, generating the to-be-detected emergent light under the action of the electro-optical crystal.

For example, in the polarization modulation, a Faraday reflector is disposed after the electro-optical crystal, such that the light source passes through the electro-optical crystal twice to generate the to-be-detected emergent light. The Faraday reflector is configured to eliminate the interaction of the electro-optic crystals.

For another example, in the polarization modulation, a polarization controller is disposed after the electro-optical crystal, such that the light source passes through the electro-optical crystal and the polarization controller to generate emergent light. The polarization controller is configured to compensate for polarization drift due to environmental change of the optical path from the electro-optical crystal to the polarization beam splitter.

For another example, in the polarization modulation, the polarization controller and the polarization beam splitter are disposed after the electro-optical crystal, such that the light source generates the to-be-detected emergent light after passing through the electro-optical crystal, the polarization controller and the polarization beam splitter.

In an example, the light source generates the to-be-detected emergent light under the action of the electro-optical crystal, which includes: based on the phase modulation, the light source generates the to-be-detected emergent light under the action of the electro-optical crystal.

In an example, based on the phase modulation, the light source generating the to-be-detected emergent light under the action of the electro-optical crystal includes: generating, based on the phase modulation, emergent light under the action of the electro-optical crystal, and performing an interference operation on the emergent light to obtain the to-be-detected emergent light.

In the phase modulation, for example, the light source may be divided into two beams, in which one beam is incident into the electro-optical crystal to generate a modulated light beam, and the other beam does not pass through the electro-optical crystal. The phase of the modulated light beam may be changed, then the modulated beam and the other unmodulated beam are subjected to a beam interference operation to obtain the to-be-detected emergent light.

In the embodiment of the present disclosure, the microwave signal is converted into an optical signal by using the electro-optical crystal as a microwave sensor. Ununiform sampling (or compression sensing sampling) in real sense is performed by the single-photon detector detecting the light at the single-photon level, and microwave frequency measurement is realized by a time-dependent single-photon counting technology and by the discrete Fourier transform. The measurement bandwidth in the present disclosure may implement in the order of hundreds GHz, and may implement with the Fourier limit spectral resolution.

Figure 2:
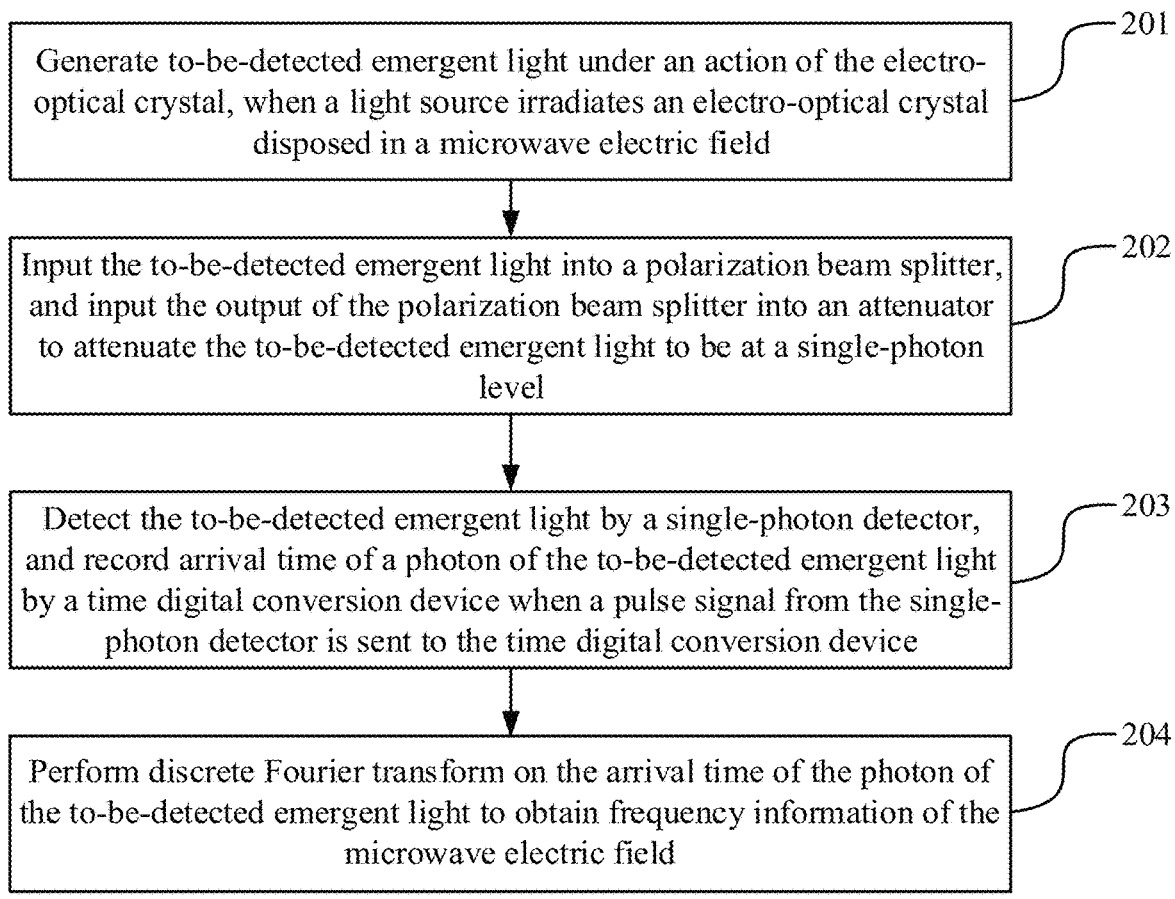
FIG. 2 is a flowchart of a frequency measurement method of a microwave signal according to an embodiment of the present disclosure.

A frequency measurement method of a microwave signal is provided according to an embodiment of the present disclosure. Specifically, a method of microwave frequency measurement by converting the microwave signal into a optical signal by using an electro-optical crystal as a sensor is provided. FIG. 2 illustrates a flowchart of the frequency measurement method of the microwave signal. The processing flow of the method may include the following steps.

At Step 201, when a light source irradiates an electro-optical crystal disposed in a microwave electric field, to-be-detected emergent light is generated under an action of the electro-optical crystal.

In the absence of an electric field, after the light emitted by the laser passes through the electro-optical crystal, the light is divided into o-light and e-light under the action of the electro-optical crystal, where the o-light is ordinary light, the e-light is extraordinary light, and the o-light follows the refractive law and the e-light does not follow the refractive law.

Figure 3:
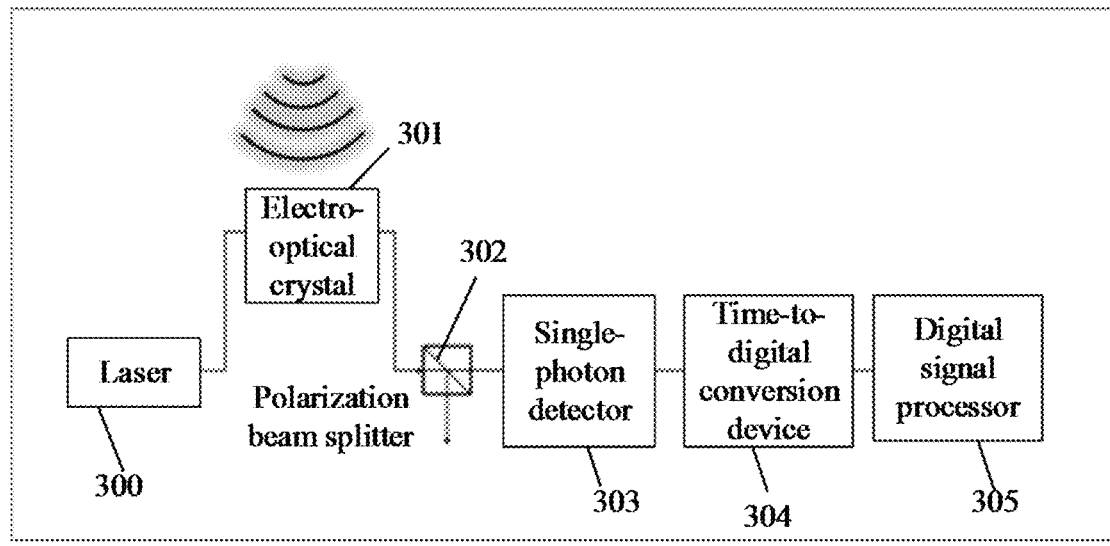
FIG. 3 is a schematic diagram of a frequency measurement of a microwave signal according to an embodiment of the present disclosure.

As shown in FIG. 3, the polarization of the light source emitted from the laser 300 is adjusted and then incident into the electro-optical crystal 301, such that an angle of 45 degrees is formed by the polarization of the light source 300 and the optical axis direction of the electro-optical crystal 301. In this embodiment, the interaction between the microwave electric field and the electro-optical crystal changes the optical transmission characteristic of the electro-optical crystal, thereby changing the polarization, phase or intensity of the to-be-detected emergent light. Correspondingly, the frequency of the microwave signal may be measured by a polarization modulation, a phase modulation or an intensity modulation.

In an example, when the polarization modulation is adopted, the polarization direction of the to-be-detected emergent light may change due to different relative refractive indices of the o-light and the e-light of the electro-optical crystal, therefore the to-be-detected emergent light may be performed with the polarization compensation. A plurality of polarization compensation methods may be adopted. For example, a Faraday reflector is disposed after the electro-optical crystal, such that the light source passes through the electro-optical crystal twice for compensating. For another example, a polarization controller disposed after the electro-optical crystal performs the polarization compensation on the to-be-detected emergent light, such that the light source passes through the electro-optical crystal and the polarization controller sequentially to generate the to-be-detected emergent light.

In another example, when the phase modulation is adopted, the light source generates primary emergent light under the action of the electro-optical crystal, and an interference operation is performed on the primary emergent light to obtain the to-be-detected emergent light.

The relative refractive indices of the o-light and e-light directions of the electro-optical crystal may change when the microwave electric field acts on the electro-optical crystal. Since the polarization direction of incident laser forms an angle of 45 degrees with the optical axis direction, components in the directions of the o-light and the e-light are the same. The change in the relative refractive indices of the o-light and e-light directions may result in a change in the relative phase of the two components of light. The electric field vector superposition of the two components obtained after the light passing though the electro-optic crystal is no longer in the original polarization direction of the incident laser light. Therefore, after passing through the polarization beam splitter 302, part of the laser will enter the single-photon detector 303, and the photon count of the single-photon detector increases. The increase in photon count is related to the modulation depth of the electro-optical crystal and the light intensity. Since the microwave electric field has a specific oscillation frequency, the wave function of the photons is periodically modulated. The probability amplitude of the photonic wave function of the unmodulated coherent light source remains unchanged in the coherence time, and the wave function may collapse due to the single-photon measurement, and the probability of the photons being measured at any moment in the coherence time is the same. After the microwave electric field modulation, the probability of the photons being measured at any moment in the coherence time is related to the microwave electric field amplitude, and therefore, the measurement of the photons may reflect the frequency and waveform information of the microwave electric field.

At Step 202, the to-be-detected emergent light is input into a polarization beam splitter, and the output of the polarization beam splitter is input into an attenuator to attenuate the to-be-detected emergent light to be at a single-photon level.

In an implementation, the interaction between the microwave electric field and the electro-optical crystal renders the relative refractive index of the electro-optical crystal to change, causing the polarization state of the to-be-detected emergent light to change. This change in polarization may be observed by the polarization beam splitter. The output of the polarization beam splitter is attenuated to be at a single-photon level after passing through the attenuator, which is helpful for detection by the single-photon detector.

In an example, when the system is in the initial state, the polarization controller in Step 201 may be adjusted, such that the to-be-detected emergent light passing through the polarization beam splitter is concentrated in one direction, that is, the light intensity detected by the single-photon detector in the subsequent step is ensured to be the lowest.

At Step 203, the to-be-detected emergent light is detected by a single-photon detector, and arrival time of a photon of the to-be-detected emergent light is recorded by a time-to-digital conversion device when a pulse signal from the single-photon detector is sent to the time-to-digital conversion device.

In an example, when the phase modulation is adopted, information extraction needs to be performed on the interference result by the time-to-digital conversion device 304, and the arrival time of the photon of the to-be-detected emergent light then is recorded.

In another example, when the intensity modulation is adopted, the amplitude of the microwave electric field oscillation is directly related to the probability of photon emission, and information may be directly detected by single-photon detector 303.

Step 204, discrete Fourier transform is performed on the arrival time of the photon of the to-be-detected emergent light to obtain frequency information of the microwave electric field.

In an implementation, a discrete Fourier transform is performed on the arrival time of the photon of the to-be-detected emergent light by the digital signal processor 305, to obtain oscillation information of the microwave electric field, that is, to obtain frequency information of the microwave electric field.

The bandwidth of the microwave electric field that can be measured is an important indicator to evaluate the microwave frequency measurement system. In the present disclosure, the measurement bandwidth of the microwave electric field is not limited to the response bandwidth of the single-photon detector, but is limited to a time jitter of arrival time measurement of the photon. There are two factors influencing the time jitter of the arrival time measurement of the photon in the present disclosure, one is a time jitter parameter of the single-photon detector, and the other is a time jitter parameter of the time-to-digital conversion device (such as a time interval analyzer, a time single-photon counter, a time-to-digital converter, a time amplitude converter, etc.). The existing single-photon detector based on avalanche photodiode has a time jitter in the order of hundred picoseconds, and the measurement bandwidth exhibited by the single-photon detector is on the order of GHz. The superconducting single-photon detector has a time jitter of about 3 picoseconds (ps). The single-photon detector measured using the first advanced time interval analyzer has a time jitter of about 4 ps, and the time jitter of the time interval analyzer itself has been considered here.

Figure 4:
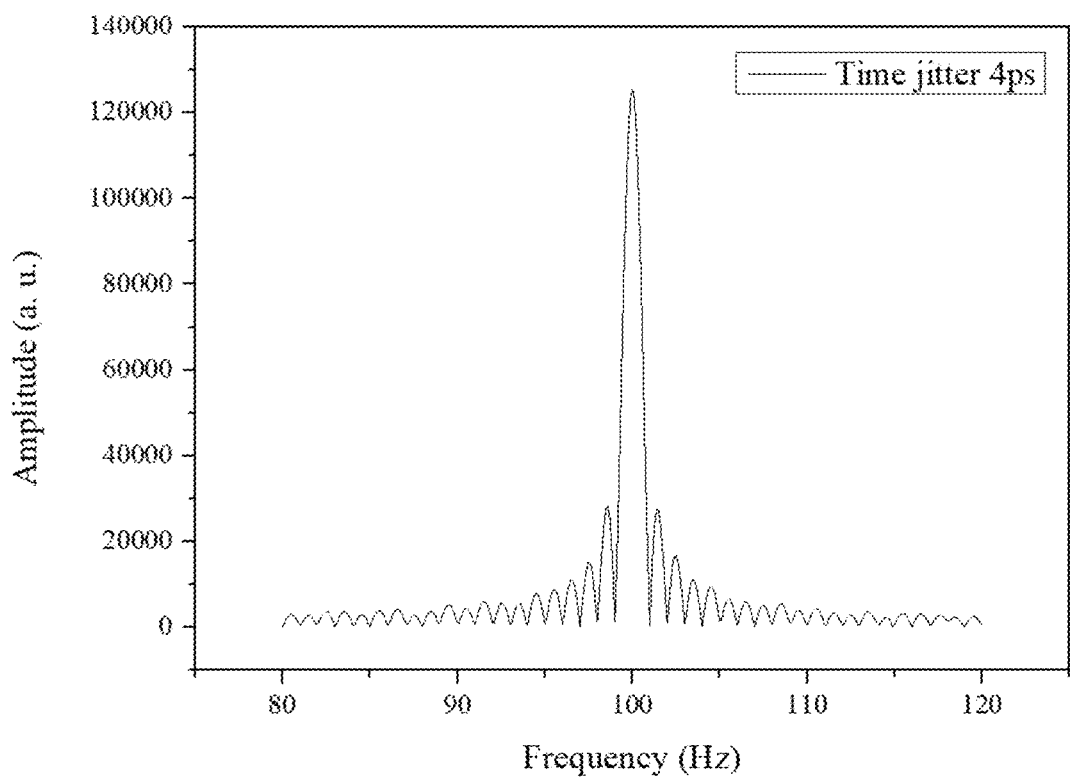
FIG. 4 is a schematic diagram of a measurement result of microwave frequency according to an embodiment of the present disclosure.
Figure 5:
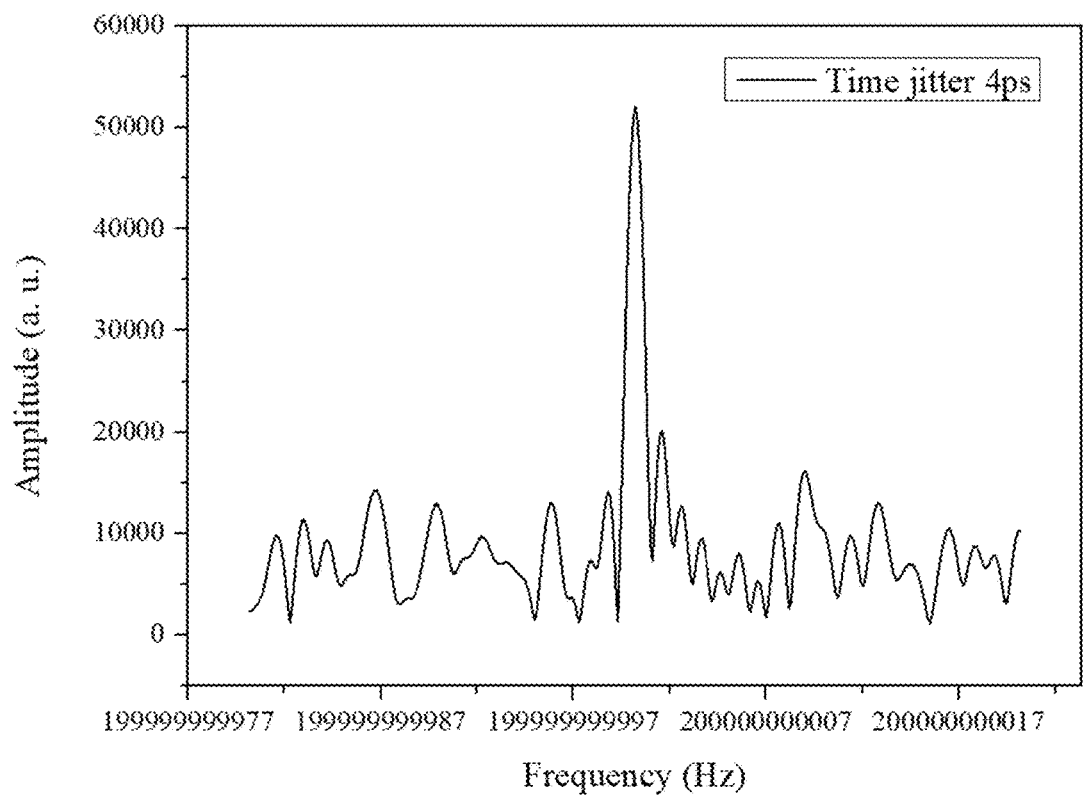
FIG. 5 is a schematic diagram of a measurement result of microwave frequency according to an embodiment of the present disclosure.
Figure 6:
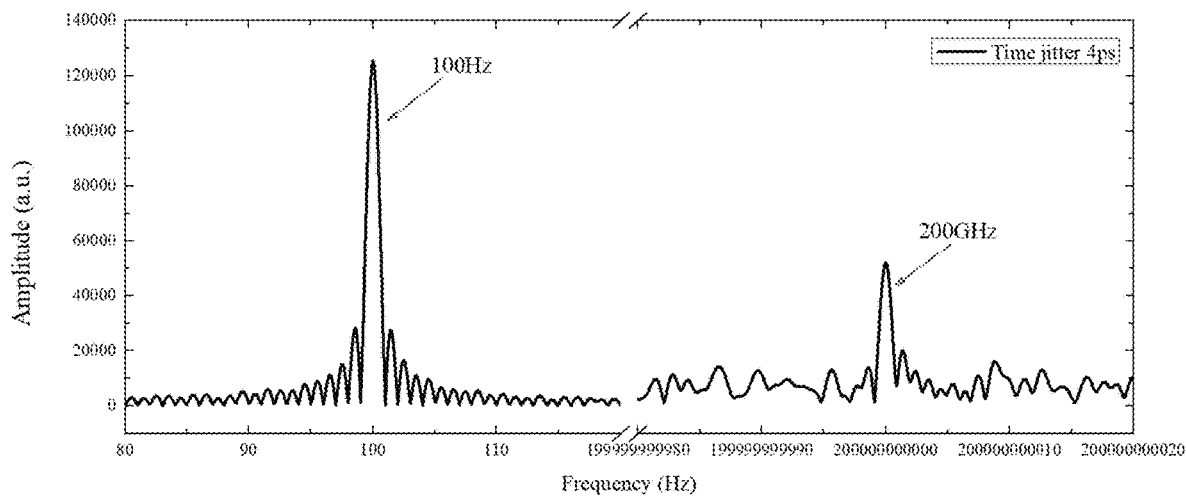
FIG. 6 is a schematic diagram of a measurement result of microwave frequency according to an embodiment of the present disclosure.

In the present disclosure, the time jitter of the system is set to 4 ps, and it is assumed that the time jitter is represented by Gaussian distribution. In order to describe the present disclosure with a wide microwave frequency measurement bandwidth, the present disclosure simulates different measurement frequencies. FIG. 4, FIG. 5 and FIG. 6 are simulation results, respectively. Here, a single-photon detector is set to have a photon count per second of 500 kcps, and a measurement time of 1 s. In FIG. 4, as the frequency of the microwave electric field is 100 Hz, a significant characteristic peak appears at a position of 100 Hz, and the signal-to-noise ratio is good. In FIG. 5, as the frequency of the microwave electric field is 200 GHz, a significant characteristic peak appears at a position of 200 GHz, but compared with the characteristic peak of 100 Hz, its amplitude and signal-to-noise ratio both decreased. This is because the influence of the time jitter on the high frequency signal is greater. Time jitter also becomes a most important factor to limit the measurement bandwidth of the present disclosure. In FIG. 6, the spectrum is obtained by 100 Hz and 200 GHz being loaded simultaneously, and two significant characteristic peaks appear at positions of 100 Hz and 200 GHz. The present disclosure is also applicable to microwave electric field frequency measurements for more frequency components. In the above results, since the measurement time is set to 1 s, it can be seen that the half-height widths of all the characteristic peaks are 1 Hz, which indicates that the system of the present disclosure has the frequency resolution of the Fourier limit.

In the present disclosure, another feature is a very low sampling rate, the conventional frequency identification method needs to satisfy the limitation of sampling theorem. That is to say, if the frequency information of the sampled waveform is obtained correctly, the sampling rate is at least 2 times or more of the measurement bandwidth. Taking the measurement bandwidth of 200 GHz illustrated in the above embodiments of the present disclosure for example, the sampling rate obtained by the conventional measurement method requires at least 400 GHz. It is not possible for existing technologies to be implemented. However, the sampling rate obtained by the present disclosure is only 500 kHz, which accord with the requirements for the existing data processing system, and is important for realizing real-time frequency measurement of a high frequency signal.

The present disclosure has at least the following beneficial effects.

In the present disclosure, a wide microwave measurement bandwidth is applicative, the measured electromagnetic wave signal may be from the order of Hz to the order of several hundred GHz, and simultaneous measurement of microwave signal frequencies at an arbitrary frequency may be realized.

In the present disclosure, the microwave frequency measurement has the frequency resolution capability of Fourier limit. The present disclosure performs microwave frequency measurement by measuring single photons, in this way, the limitation of sampling theorem required in the traditional method is overcome, and a high frequency signal frequency by a low sampling frequency is obtained.

In the present disclosure, wideband frequency signal recognition may be realized in real-time. Compared with conventional frequency measurement methods in which a large amount of data needs to be processed, microwave signal measurement of hundreds GHz bandwidth may be realized only on the order of Mbit/s in the present disclosure, which greatly reduces the requirements for the digital information processing system.

In the present disclosure, an electro-optical crystal is used as a sensor for measuring the microwave electric field, and the electro-optical crystal is a non-conductor which does not change the electric field distribution, and the field intensity distribution of the original microwave electric field.

Figure 7:
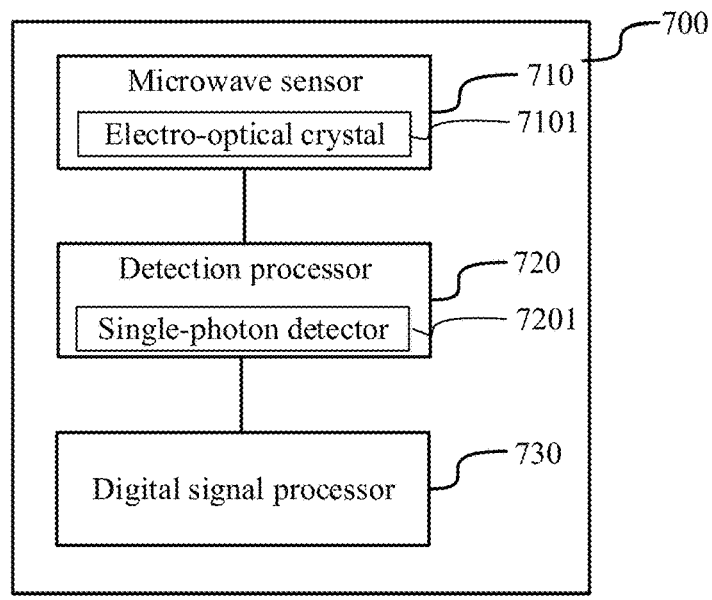
FIG. 7 is a block diagram of a frequency measurement system for a microwave signal according to an embodiment of the present disclosure.

As shown in FIG. 7, the system 700 includes a microwave sensor 710, a detection processor 720, and a digital signal processor 730.

The microwave sensor 710 includes an electro-optical crystal 7101 configured to be disposed in a microwave electric field, and when a light source irradiates on the electro-optical crystal, the light source generates to-be-detected emergent light under the action of the electro-optical crystal.

The detection processor 720 includes a single-photon detector 7201 configured to detect the to-be-detected emergent light, to obtain a detection result of the single-photon detector.

The digital signal processor 730 is configured to determine a frequency of the microwave signal in the microwave electric field based on the detection result of the single-photon detector 7201 and the Fourier transform algorithm.

In the embodiment of the present disclosure, the microwave signal is converted into an optical signal by using the electro-optical crystal as a microwave sensor. Uneven sampling (or compression sensing sampling) in real sense is realized by the single-photon detector detecting the light at single-photon level, and microwave frequency measurement is realized by a time-dependent single-photon counting technology and by the discrete Fourier transform. The spectral bandwidth measurement in the present disclosure may implement the order of hundred GHz, and may implement the Fourier limit spectral resolution.

Figure 8:
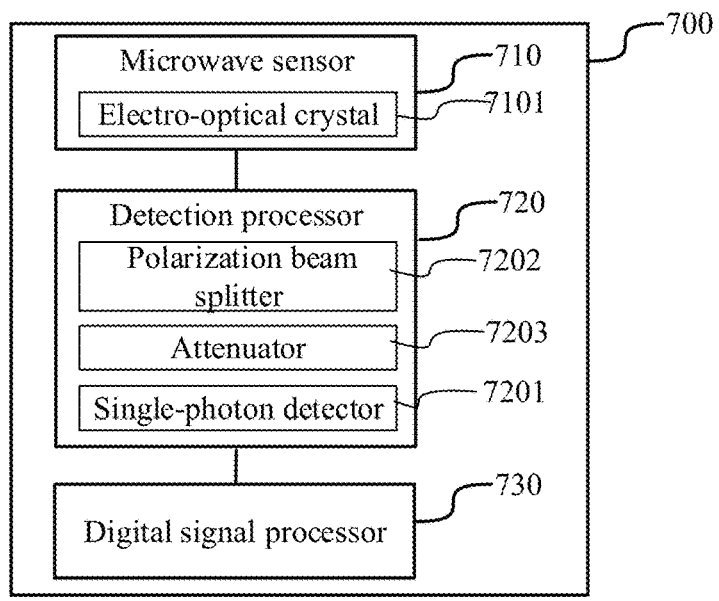
FIG. 8 is a block diagram of a frequency measurement system for a microwave signal according to an embodiment of the present disclosure.

In an example, as shown in FIG. 8, the detection processor 720 further includes a polarization beam splitter 7202 and an attenuator 7203. The to-be-detected emergent light is input into the polarization beam splitter 7202, then an output of the polarization beam splitter 7202 is input into the attenuator 7203, so the to-be-detected emergent light is attenuated to be in a single light quantum level.

In an example, the single-photon detector 7201 is configured to detect the to-be-detected emergent light at a single-photon level.

Figure 9:
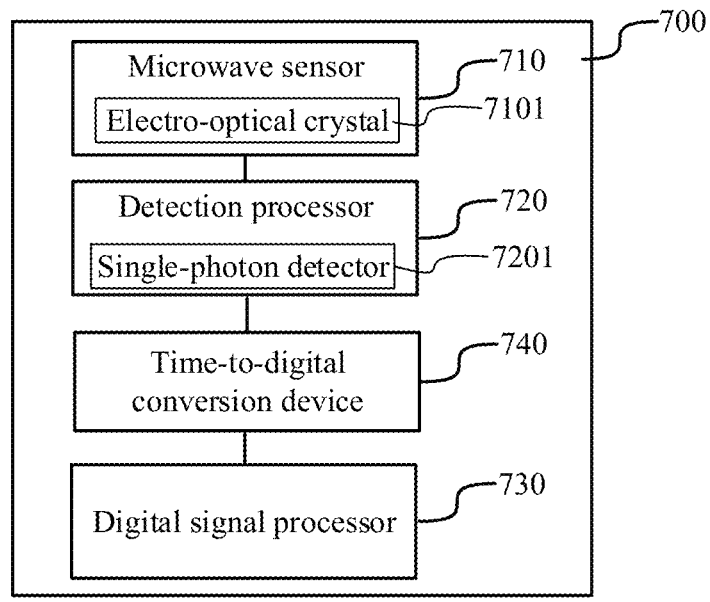
FIG. 9 is a block diagram of a frequency measurement system for a microwave signal according to an embodiment of the present disclosure.

In an example, as shown in FIG. 9, the system 700 further includes a time-to-digital conversion device 740. The above detection result includes the arrival time of the photon of the to-be-detected emergent light. In this case, the single-photon detector 7201 detects the to-be-detected emergent light. The time-to-digital conversion device 740 is configured to record the arrival time of the photon when the pulse signal from the single-photon detector 7201 passes through the time-to-digital conversion device 740.

In an example, the digital signal processor 730 is configured to perform discrete Fourier transform on the arrival time of the photon of the to-be-detected emergent light to obtain frequency information of the microwave electric field.

Figure 10:
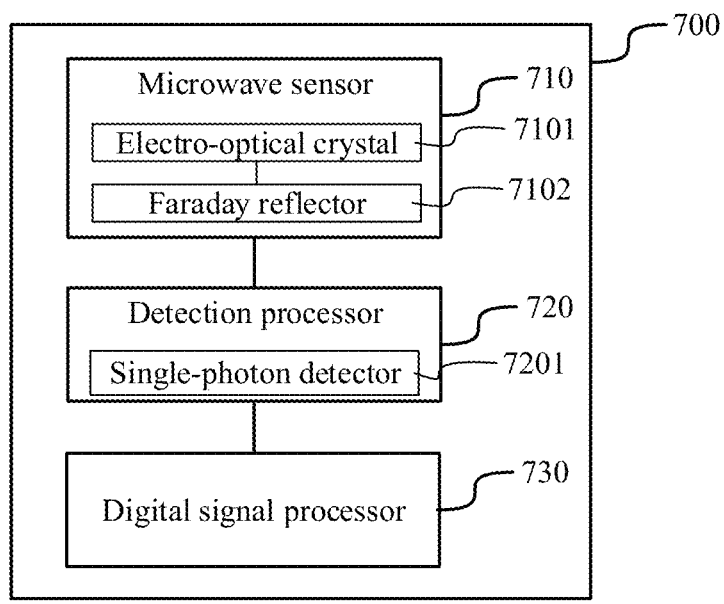
FIG. 10 is a block diagram of a frequency measurement system for a microwave signal according to an embodiment of the present disclosure.

In an example, as shown in FIG. 10, the microwave sensor 710 further includes a Faraday reflector 7102. The Faraday reflector 7102 is located behind the electro-optical crystal 7101, such that the light source passes through the electro-optical crystal 7101 twice to generate the to-be-detected emergent light. In another example, the Faraday reflector 7102 may be independent of the microwave sensor 710, that is, the Faraday reflector 7102 may be separately disposed and located outside the microwave sensor 710.

Figure 11:
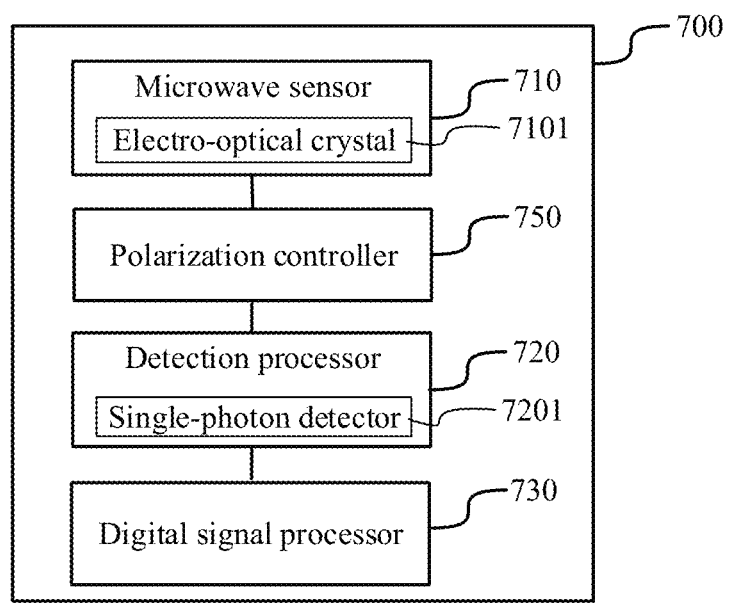
FIG. 11 is a block diagram of a frequency measurement system for a microwave signal according to an embodiment of the present disclosure.

In an example, as shown in FIG. 11, the system 700 further includes a polarization controller 750. The polarization controller 750 is located after the electro-optical crystal 7101, such that the light source generates the to-be-detected emergent light when the light source passes through the electro-optical crystal 7101 and the polarization controller 750.

A person of ordinary skill in the art would understand that all or part of the steps of the foregoing embodiments may be implemented by hardware, or may be completed by a program instructing relevant hardware. The program may be stored in a computer readable storage medium. The storage medium may be a read-only memory, a magnetic disk, or an optical disk.

The above are merely some embodiments of the present disclosure, and are not intended to limit the present disclosure. Any modifications, equivalent replacements, improvements, etc. made within the spirit and principle of the present disclosure should be included within the scope of protection of the present disclosure.

What is claimed is:

1. A frequency measurement method of a microwave signal, comprising:
   generating, when a light source irradiates an electro-optical crystal disposed in a microwave electric field, to-be-detected emergent light under an action of the electro-optical crystal, wherein a wave function of the to-be-detected emergent light is periodically modulated with a specific oscillation frequency of the microwave electric field;
   inputting the to-be-detected emergent light into a polarization beam splitter;
   inputting an output of the polarization beam splitter into an attenuator to attenuate the to-be-detected emergent light to be at a single-photon level;
   detecting, by a single-photon detector, the to-be-detected emergent light to obtain a detection result of the single-photon detector, wherein the detection result comprises an arrival time of a photon of the to-be-detected emergent light; and
   determining a frequency of the microwave signal in the microwave electric field based on the detection result of the single-photon detector and a Fourier transform algorithm,
   wherein generating the to-be-detected emergent light under the action of the electro-optical crystal comprises:
   generating, based on a polarization modulation, by placing a Faraday reflector after the electro-optical crystal, the to-be-detected emergent light when the light source passes through the electro-optical crystal twice.

2. The method according to claim 1, wherein detecting, by the single-photon detector, the to-be-detected emergent light comprises:
   detecting, by the single-photon detector, the to-be-detected emergent light at the single-photon level.

3. The method according to claim 1, wherein
   detecting, by the single-photon detector, the to-be-detected emergent light to obtain the detection result of the single-photon detector comprises:
   detecting, by the single-photon detector, the to-be-detected emergent light, and
   recording, by a time-to-digital conversion device, the arrival time of the photon of the to-be-detected emergent light when a pulse signal from the single-photon detector is sent to the time-to-digital conversion device.

4. The method according to claim 3, wherein determining the frequency of the microwave signal based on the detection result of the single-photon detector and the Fourier transform algorithm comprises:
   performing a discrete Fourier transform on the arrival time of the photon of the to-be-detected emergent light to obtain frequency information of the microwave electric field.

5. The method according to claim 1, wherein when the light source irradiates the electro-optical crystal, the method further comprises:
   adjusting a polarization direction of the light source incident into the electro-optical crystal, such that an angle of 45 degrees is formed by the polarization direction of the light source and an optical axis direction of the electro-optical crystal, wherein a refractive index of an o-light of the electro-optical crystal is different from a refractive index of an e-light of the electro-optical crystal.

6. The method according to claim 1, wherein generating the to-be-detected emergent light under the action of the electro-optical crystal comprises:
   generating, based on a phase modulation, the to-be-detected emergent light under the action of the electro-optical crystal.

7. The method according to claim 6, wherein generating, based on the phase modulation, the to-be-detected emergent light under the action of the electro-optical crystal comprises:
   generating, based on the phase modulation, primary emergent light under the action of the electro-optical crystal, and
   performing an interference operation on the primary emergent light to obtain the to-be-detected emergent light.

8. A frequency measurement system for a microwave signal, comprising:
   a microwave sensor, comprising an electro-optical crystal configured to be disposed in a microwave electric field, wherein when a light source irradiates on the electro-optical crystal, the light source generates to-be-detected emergent light under the action of the electro-optical crystal, wherein a wave function of the to-be-detected emergent light is periodically modulated with a specific oscillation frequency of the microwave electric field, and wherein the generating of the to-be-detected emergent light under the action of the electro-optical crystal comprises: generating, based on a polarization modulation, by placing a Faraday reflector after the electro-optical crystal, the to-be-detected emergent light when the light source passes through the electro-optical crystal twice;

a detection processor, comprising a polarization beam splitter, an attenuator configured to receive an input from the polarization beam splitter, and a single-photon detector configured to receive an input from the attenuator, such that when the to-be-detected emergent light is sequentially input into the polarization beam splitter and the attenuator, the output from the attenuator is attenuated to be at a single-photon level, and the single-photon detector is configured to detect the to-be-detected emergent light, to obtain a detection result of the single-photon detector, wherein the detection result comprises an arrival time of photons of the to-be-detected emergent light; and a digital signal processor, configured to determine a frequency of the microwave signal in the microwave electric field based on the detection result of the single-photon detector and a Fourier transform algorithm.

9. The system according to claim 8, wherein the single-photon detector is configured to detect the to-be-detected emergent light at the single-photon level.

10. The system according to claim 8, wherein the system further comprises:

a time-to-digital conversion device, configured to record the arrival time of the photons of the to-be-detected emergent light when a pulse signal from the single-photon detector is sent to the time-to-digital conversion device.

11. The system according to claim 10, wherein the digital signal processor is configured to:

perform a discrete Fourier transform on the arrival time of the photons of the to-be-detected emergent light to obtain the frequency of the microwave electric field.

* * * * *